(12) United States Patent
Takami et al.

(10) Patent No.: US 6,560,148 B2
(45) Date of Patent: May 6, 2003

(54) SEMICONDUCTOR MEMORY HAVING MIRRORING FUNCTION

(75) Inventors: Kazuhiko Takami, Hyogo (JP); Yoshito Nakaoka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/978,006

(22) Filed: Oct. 17, 2001

(65) Prior Publication Data

US 2002/0141252 A1 Oct. 3, 2002

(30) Foreign Application Priority Data

Feb. 13, 2001 (JP) ........................................ 2001-034964

(51) Int. Cl.⁷ ................................................ G11C 7/00
(52) U.S. Cl. .................... 365/190; 365/63; 365/220; 365/230.03
(58) Field of Search ........................ 365/63, 220, 221, 365/219, 189.04, 230.03, 190, 210

(56) References Cited

U.S. PATENT DOCUMENTS

| | | | | |
|---|---|---|---|---|
| 4,386,419 A | * | 5/1983 | Yamamoto | 365/190 |
| 5,301,162 A | * | 4/1994 | Shimizu | 365/230.03 |
| 5,305,266 A | * | 4/1994 | Rountree | 365/220 |
| 5,594,704 A | * | 1/1997 | Konishi et al. | 365/233 |
| 5,896,337 A | * | 4/1999 | Derner | 365/220 |
| 5,973,984 A | * | 10/1999 | Nagaoka | 365/230.03 |
| 6,072,749 A | * | 6/2000 | Nakamura et al. | 365/238.5 |
| 6,307,800 B1 | * | 10/2001 | Derner | 365/220 |

FOREIGN PATENT DOCUMENTS

JP          58-56296          4/1983

* cited by examiner

*Primary Examiner*—David Nelms
*Assistant Examiner*—Gene N. Auduong
(74) *Attorney, Agent, or Firm*—McDermott, Will & Emery

(57) ABSTRACT

Data of a plurality of memory cells are read on a plurality of first data lines and combined by a combination/rewrite circuit and transmitted on a second data line and the combined data is written back to the first data line. In combining data, the combination/rewrite circuit performs an addition. Mirrored data can be improved in reliability and a function of correcting an error of the mirror data can also be implemented.

8 Claims, 13 Drawing Sheets

F I G. 4A  WHEN STORED DATA (OF HIGH LEVEL) IS NORMALLY READ

F I G. 4B  WHEN STORED DATA (OF HIGH LEVEL) IS DESTROYED (LOW LEVEL)

IT MAY BE AN INTERCONNECTION LINE.

$$Vsn = \begin{pmatrix} Vcc\ ("H") \\ 0V\ ("L") \end{pmatrix}$$

SEMICONDUCTOR MEMORY HAVING MIRRORING FUNCTION

BACKGROUND OF THE INVENTION

1. Field of the Invention

The present invention relates generally to semiconductor memory devices and particularly to semiconductor memory devices having a mirroring function of handling a plurality of bits of memory cells as a 1-bit, pseudo memory cell in accessing data.

2. Description of the Background Art

FIG. 11 schematically shows a configuration of a portion related to data of one bit of a conventional semiconductor memory device. In FIG. 11, the semiconductor memory device includes: memory sub arrays MSA0–MSAn each having a plurality of memory cells arranged in rows and columns; row decoders RD0–RDn provided corresponding to memory sub arrays MSA0–MSAn, respectively, each for selecting a row of a corresponding memory sub array; a column decoder CD provided commonly to memory sub arrays MSA0–MSAn to select a column in memory sub arrays MSA0–MSAn; internal IO line pairs IOP0–IOPn provided corresponding to memory sub arrays MSA–MSAn, respectively, and each coupled with a column selected by column decoder CD of a corresponding memory sub array; preamplifiers PAM0–PAMn provided corresponding to internal line IO line pairs IOP0–IOPn, respectively, and selectively activated to amplify data on their corresponding internal IO line pairs IOP0–IOPn and transmit the amplified data to an internal data line pair DBP; and a main amplifier MAP for amplifying the data on internal data line pair DBP and externally outputting the amplified data.

Memory array MA shown in FIG. 11 configures one IO block and externally communicates data of one bit.

Preamplifiers PAM0–PAMn are selectively activated according to an address bit specifying a memory sub array. Internal IO line pairs IOP0–IOPn and internal data line pair DBP each transfer data of one bit.

FIG. 12 schematically shows a configuration of memory sub arrays MSA0–MSAn shown in FIG. 11. Since these memory sub arrays MSA0–MSAn are identical in configuration, FIG. 12 shows a configuration of one memory sub array MSAi representatively, wherein i=0 to n.

In FIG. 12, memory sub array MSAi includes: a plurality of memory cells MCs arranged in rows and columns; a bit line pair BLP (BLP0–BLP3) arranged corresponding to each column of memory cells MCs; a word line WL (WL0–WLm) arranged corresponding to each row of memory cells MCs; a sense refresh amplifiers SA (SA–SA3) provided corresponding to bit line pairs BLP and each activated in response to a signal on sense drive lines S2P and S2N; a sense amplifier driver SAD for driving sense drive lines S2P and S2N in response to sense amplifier activation signals ZSOP and SON; and a column select gates CG (CG0–CG3) provided corresponding to bit line pairs BLP (BLP0–BLP3), and each operative in response to a column select signal CSL (CSL0–CSL3) to connect a corresponding bit line pair to internal IO line pair IOP.

Although memory sub array MSAi has a plurality of columns of memory cells arranged therein, FIG. 12 representatively shows memory cells arranged in four columns.

A memory cell MC includes a capacitor MS for storing information, and an access transistor (an N-channel MOS (insulated gate type) transistor) MT operative in response to a signal on a corresponding word line WL to connect capacitor MS to a corresponding bit line.

Bit line pair BLP includes a bit line BL (BL0–BL3) and a bit line ZBL (ZBL0–ZBL3). Memory cell MC is arranged corresponding to a crossing of one of bit lines BL and ZBL of a corresponding bit line pair BLP and a corresponding word line WL.

Sense refresh amplifier SA includes a P sense amplifier configured of cross-coupled P-channel MOS transistors, and cross-coupled N-channel MOS transistors. When sense drive line S2P attains a power supply voltage level, the P sense amplifier is activated to drive, to the power supply voltage level, a bit line at a higher potential in a corresponding bit line pair. When sense drive line S2N is driven low, the N sense amplifier is activated to drive, to a low level of a ground voltage level for example, a bit line at a lower potential in the corresponding bit line pair.

Sense amplifier driver SAD drives sense drive lines S2N and S2P to a low level and a high level, respectively, in response to a sense start signal SA and a restore signal GZOP to activate sense refresh amplifier SA (SA0–SA3).

Column select gate CG (CG0–CG3) includes transfer gates TX connecting bit lines BL and ZBL of a corresponding bit line pair BLP to IO lines IO and ZIO of internal IO line pair IOP in response to a corresponding column select signal. In response to column select signal CSL (one of CSL0–CSL3), a column is selected in each memory sub array and bit line pair BLP of a corresponding column is connected to a corresponding internal IO line pair IOP. A data read operation for memory sub arrays shown in the FIG. 12 will now be described with reference to a signal waveform diagram shown in FIG. 13.

In a standby state, a bit line precharge/equalization circuit (not shown) precharges and equalizes each bit line BL and ZBL to a voltage level of an intermediate voltage, which is equal to Vcc/2. In the following description, bit lines BL and ZBL will be referred to as generically indicating bit lines BL0–BL3 and ZBL0–ZBL3 shown in FIG. 12. The bit line precharge/equalization circuit is provided for each bit line pair and it is activated when a bit line precharge/equalization instructing signal BLEQ is at a high level.

In the standby state, internal IO lines ZIO and IO are also precharged to the power supply voltage Vcc level.

When an active cycle starts, a row decoder is first activated to drive a word line WL corresponding to an addressed row to a boosted voltage Vpp level of a selected state. When word line WL is driven to the selected state, a memory cell connected to the selected word line WL has its storage data read on a corresponding bit line BL or ZBL. FIG. 13 represents a signal waveform when high-level data is read on bit line BL.

Then, when a predetermined period of time elapses, sense start signal SON is activated, sense amplifier driver SAD drives sense drive line S2N to a low level. Responsively, sense refresh amplifier SA (generically referring to SA0–SA3 unless otherwise mentioned) is activated and bit line ZBL at a low potential level is discharged to a ground voltage level.

Restore signal ZSOP is then driven to attain a low level and sense drive line S2P is responsibly driven to attain the power supply voltage Vcc level. Thus, bit line BL is driven to attain the power supply voltage level. Sense refresh amplifier SA has a configuration of a flip-flop configured of cross-coupled P-channel MOS transistors and cross-coupled N-channel MOS transistors and it has a latch function. After this restoring completes, bit lines BL and ZBL is held by self refresh amplifier SA at a high level and a low level depending on the data of the selected memory cell.

In accessing a column, in response to a column address signal, a column select signal CSL for selecting an addressed column is driven into a selected state by column decoder CD. A corresponding column select gate CG is rendered conducts and bit line pair BLP corresponding to this column select gate is connected to internal IO line pair IOP. Internal IO lines IO and ZIO are clamped in reading data to the power supply voltage Vcc level, and internal IO lines IO and ZIO have their respective potentials varying with the data latched by the sense amplifier. In FIG. 13 bit line ZBL is at a low level, and internal IO line ZIO attains a voltage level lower than that of internal IO line IO.

A signal of a small amplitude on the internal I/O line is amplified by preamplifier PAM to be a signal of a CMOS level and the amplified signal is transmitted through internal data line pair DBP. When a column select operation completes, column select signal CSL is driven low. The signal on internal data line pair DBP is amplified by the main amplifier at a predetermined timing and then externally output.

When one memory cycle completes, word line WL in the selected state is driven into a non-selected state and the access transistor MT of the selected memory cell turns off. Then sense start signal SON and restore signal ZSOP are driven to the low level and the high level, respectively, and thus inactivated, and bit lines BL and ZBL enter a floating state. Then bit line precharge/equalization instructing signal BLEQ is driven high to be an active state, and bit lines BL and ZBL are precharged and equalized by a bit line precharge/equalization circuit (not shown) to attain an intermediate voltage level.

FIG. 14 schematically shows a configuration of a circuit from internal data line pair IOP to a data input/output terminal. FIG. 14 representatively shows a configuration provided corresponding to three internal IO line pairs IOP0–IOP2. Internal IO line pairs IOP0–IOP2 are provided in parallel corresponding to a 1-bit data input/output terminal and they are selectively coupled with internal data line pair DBP.

Corresponding to these internal data line pairs IOP0–IOP2, preamplifiers PAM0–PAM2 are provided, respectively. When select signals SEL0–SE02 are activated, preamplifiers PAM–PAM2 are activated in response to a preamplifier enable signal (not shown) to amplify complementary signals on corresponding internal IO line pairs IOP0–IOP2 and transmits the amplified signals to internal data line pair DBP. Corresponding to IO line pairs IOP0–IOP2, write drivers WDR0–WDR2 are provided, respectively. When select signals SEL0–SEL2 are selected and activated, write drivers WDR0–WDR2 are enabled in response to a write driver enable signal (not shown) to generate internal write data from signals on internal data line pair DBP and transmit the generated data to a corresponding internal IO line pair. Select signals SEL0–SEL2, . . . are activated through decoding of an address bit specifying a memory sub array.

Internal data line pair DBP is provided with a data latch circuit DLK entering a through state, in response to a read data latch instruction signal RDL, for a predetermined period of time and enter a latching state for the period of time excluding the predetermined period of time. A signal output from data latch circuit DLK is transmitted to main amplifier MAP. Reference will now be made to a signal waveform shown in FIG. 15 to describe an operation in reading data of the configuration of FIG. 14.

When column select signal CSL is driven high, data latched by a sense refresh amplifier that is arranged for a selected column of a corresponding memory sub array, is transmitted to each of internal IO line pairs IOP0–IOP2 (IO lines IO and ZIO).

When the potential of a signal on an internal IO line is sufficiently developed, a preamplifier enable signal PAE is activated and preamplifier PAM selected by select signals SEL0–SEL2 is activated to amplify complementary data on a corresponding internal IO line pair.

When preamplifier enable signal PAE is activated, data latch instructing signal RDL attains a low level for a predetermined period of time and data latch circuit DLK enters a through state to pass and also latch the data on internal data line pair DBP transmitted by a selected preamplifier PAM. Then, in response to a signal transmitted by data latch circuit DLK main amplifier MAP drives a data input/output terminal and external read data DQ is generated.

Main amplifier MAP drives the data terminal in three values in response to complementary signals on internal data line pair DBP that are transmitted via data latch circuit DLK. Specifically, when internal data lines DB and ZDB are both set to a high level, the data input/output terminal outputs read data DQ in a high impedance state (Hi-Z). When internal data lines ZDB and DB are at a low level and a high level, read data DQ goes high. When internal data lines ZDB and DB are at a high level and a low level, respectively, read data DQ is driven low.

Data latch circuit DLK and main amplifier MAP are reset after a column access completes. For example, they are reset by an address transition detection signal ATD or inactivation of a column address strobe signal/CAS.

An amplitude of internal IO line pair IOP is determined by low-level data latched by sense refresh amplifier SA, and the signals on internal data lines DB and ZDB are driven by preamplifier PAM to the CMOS level signal.

As described above, in a dynamic random access memory (DRAM), an electric charge stored in a capacitor MS, is read on a corresponding bit line and a variation in voltage attributed to the read electric charge is amplified by a sense refresh amplifier and then transmitted to an internal IO line pair. This variance ΔV in voltage on a bit line attributed to data of a memory cell read on the bit line, is determined depending on the amount of electric charge accumulated in a memory cell capacitor, as given typically in the following expression:

$$\Delta V = (Vcc/2) \cdot \{1/(1+Cb/Cs)\},$$

where Cs represents a capacitance of memory cell capacitor Ms and Cb represents a stray capacitance of a bit line.

In recent years, as sub-micro-fabrication techniques have advanced, a memory cell capacitor is reduced in capacitance value and a bit line accordingly receives a small voltage change (read voltage), and memory cell data is more likely read erroneously. If a 1-bit memory cell is defective and cannot be repaired, the memory device of interest is determined to be defective. To eliminate such a possibility and accurately read memory cell data, data is mirrored. Conventionally, data is mirrored by storing single data at a plurality of bit locations and handling these multiple bits in a pseudo manner as one bit to repair a defective bit in a magnetic disc device, for example, to ensure that data is accurately recorded/reproduced.

FIG. 16 shows a configuration of a conventional memory array with such a mirroring technique applied. In FIG. 16, word lines WL0–WLn are connected to row decoder RD. Word line WL0 is coupled with three branch word lines WL01–WL3, and word line WLn is also coupled with three branch word lines WLn1–WLn3. A row of memory cells is connected to each of branch word lines WL01–WL03 and WLn1–WLn3 in a memory sub array.

A bit line has a configuration similar to that shown in FIG. 12, and a sense refresh amplifier SA and a bit line precharge/equalization circuit P/E are provided corresponding to each bit line pair. Bit line precharge/equalization circuit P/E includes precharging N-channel MOS transistors Q0 and Q1 responsive to a bit line precharge/equalization signal BLEQ and an equalizing N-channel MOS transistor Q2 responsive to the bit line precharge/equalization signal BLEQ. When bit line precharge/equalization indicating signal BLEQ is activated, N-channel MOS transistors Q0 and Q1 turn on to transmit a precharge voltage VBL to bit lines ZBL and BL, respectively, and N-channel MOS transistor Q2 also turns on to electrically short-circuit bit lines BL and ZBL.

Sense refresh amplifier SA includes cross-coupled N-channel MOS transistors NQ0 and NQ1 and cross-coupled P-channel MOS transistors PQ0 and PQ1. N-channel MOS transistors NQ0 and NQ1 have their source coupled with sense drive line S2N and P-channel MOS transistors PQ0 and PQ1 have their source coupled with sense drive line S2P. Column select gate CG includes transfer gates TX connecting bit lines ZBL and BL to internal IO lines ZIO and IO in response to a column select signal CSL.

For each of word lines WL0–WLn, memory cells connected to corresponding branch word lines Wli–Wli3 are connected to a common bit line. In FIG. 16, memory cells MC1–MC3 are arranged at crossings of the branch word lines WL01–WL03, and bit line ZBL and memory cells MC1–MC3 are arranged at crossings of the branch word lines WLn1–WLn3 and bit line BL. These memory cells of three bits simultaneously selected will be referred to as a "mirror memory cells" hereinafter.

When row decoder RD selects one word line WLi, memory cells MC1–MC3 of three bits simultaneously transmit stored data on bit line BL or ZBL. In a memory cell arrangement using this mirroring technique also, bit line potential variation is the same as that shown in FIG. 13. Now, a description will now be made specifically of a bit line read voltage when the mirroring technique is used.

As shown in FIG. 17, memory cells MC1–MC3 are arranged corresponding to crossings of word line WL and bit line BL for the sake of description. For memory cells MC1–MC3, their respective storage nodes have voltages Vsn1, Vsn2 and Vsn3, and their memory capacitors each have a capacitance value Cs. These storage node voltages Vsn1–Vsn3 are at the power supply voltage Vcc level in storing high-level data and at a ground voltage (0V) level in storing low-level data. The memory cell capacitor has a cell plate receiving a voltage Vcp, which is equal to Vcc/2.

For bit line BL, there exists stray capacitance Cb. Furthermore, bit line BL is precharged to the intermediate voltage VBL, which is equal to Vcc/2.

As shown in FIG. 17B, when memory cells MC1–MC3 are in a non-selected state, their respective access transistors turn off and the capacitors are disconnected from the corresponding bit line BL. The total amount QA of electric charge stored in the memory capacitors and that stored in the stray capacitance of a bit line in this non-selected state, can be represented in the following expression:

$$QA = Cs \cdot (Vsn1 - Vcp) + Cs \cdot (Vsn2 - Vcp) + Cs \cdot (Vsn3 - Vcp) + Cb \cdot VBL,$$

where storage node voltages Vsn1–Vsn3 each are either power supply voltage Vcc or ground voltage 0V.

Then, as shown in FIG. 17C, when word line WL is selected, these memory cells have their capacitors connected to the corresponding bit line and electric charge moves. Since a memory cell capacitor and the stray capacitance of the bit line are connected in parallel to bit line BL, electric charge QB currently stored in the memory cell capacitors is represented by the following equation:

$$QB = 3 \cdot Cs(Vsn - Vcp) + Cb \cdot VB.$$

Since the storage node voltage Vsn of each of the memory capacitors is equal to an electrode voltage VB of the bit line stray capacitance Cb, i.e., Vsn=VB, the following expression can be obtained:

$$QB = 3 \cdot Cs(Vsn - Vcp) + Cb \cdot Vsn.$$

Thus, when the memory cells normally store data, they store data at the same logic level and the following expression can be established:

$$Vsn1 = Vsn2 = Vsn3 = Vsn0.$$

Therefore, from the principle of conservation of electric charge, QA is equal to QB, and the following expression can be obtained:

$$3 \cdot Cs \cdot Vsn0 + Cb \cdot VBL = 3 \cdot Cs \cdot Vsn + Cb \cdot Vsn.$$

Thus, when memory cells are selected, a bit line voltage variation ΔVb, which is equal to Vsn−VBL, is represented by the following expression:

$$\Delta Vb = Vsn - VBL$$
$$= 3 \cdot Cs \cdot (Vsn0 - VBL) / (3Cs + Cb).$$

Thus, as shown in FIG. 17D, if intermediate voltage VBL is at an intermediate value of a power supply voltage, i.e., Vcc/2, a bit line receives a read voltage ΔV=|ΔVb| equal to (Vcc/2)/(1+Cb/3Cs) in both reading high-level data and reading low-level data.

If one of memory cells MC1–MC3 has its storage data destroyed and storage node voltages Vsn1 and Vsn2 are equal to a voltage VsnA and storage node voltage Vsn3 is equal to a voltage VsnB in a standby state for the sake of description. In the standby state, the total amount QA of electric charge stored in the memory cell capacitors and a bit line stray capacitance can be represented by the following equation:

$$QA = 2 \cdot Cs \cdot (VsnA - Vcp) + Cs \cdot (VsnB - Vcp) + Cb \cdot VBL,$$

where storage node voltages VsnA and VsnB are at different logic levels.

The total electric charge QB stored in the capacitors connected to a bit line after a word line is selected, can be represented similarly as in a normal state, as follows:

$$QB = 3 \cdot Cs \cdot (Vsn - Vcp) + Cb \cdot Vsn.$$

Therefore, a bit line voltage variance ΔVb in reading data can be represented by the following equation:

$$\Delta Vb = Vsn - VBL$$
$$= 2 \cdot (VsnA + VsnB - 3 \cdot VBL) / (3 + Cb/Cs).$$

If one bit is defective, a bit line voltage has two different values depending on the following two conditions, as shown in FIG. 17E:

If VsnA=Vcc and VsnB=0V, then ΔVb=(½)·Vcc/(3+Cb/Cs).

If VsnA=0V and VsnB=Vcc, then ΔVb=(-½)·Vcc/(3+Cb/Cs).

Thus, in mirror memory cells storing data of one bit, the memory cells of three bits have the same data written therein, and in a normal read operation electric charge three times greater than in a conventional case is transmitted on an associated bit line. This, bit line voltage level is determined by a so-called "principle of decision by majority" depending on electric charge stored in memory cell capacitors.

If a memory cell of one bit in the mirror memory cells has the storage data inverted due to a soft error or the like, the remaining two bits compensate for the inverted data of one bit and, electric charge corresponding to correct data of a 1-bit memory cell in total is transmitted to a bit line, similarly as in a conventional case. Then, by rewriting data via a sense refresh amplifier, correct data can be written back. After data is read, correct data can be stored in all the mirror memory cells of the three bits. Since data is read according to the principle of decision by majority as described above, it is desirable to form the mirror memory cells by an odd number of bits of memory cells.

FIG. 18A shows another configuration of an array of a semiconductor memory device using a conventional mirroring technique. In the array configuration shown in FIG. 18A, word lines WL0–WLn from a row decoder are each divided into two branch word lines. Specifically, word line WL0 branches into branch word lines WL01 and WL02 and word line WLn branches into branch word lines WLn1 and WLn2. For these sets of branch word lines, memory cells are arranged such that memory cell data are read on bit lines ZBL and BL when a corresponding branch word lines are selected. More specifically, mirror memory cells include a memory cell MCb connected to bit line BL and a memory cell MCa connected to bit line ZBL. The remaining of the configuration of the bit line peripheral circuit is identical to the configuration shown in FIG. 16.

In the array arrangement in FIG. 18A, when a word line is selected, memory cell data are read on bit lines BL and ZBL. Sense refresh amplifier SA differentially amplifies potentials of the signals on bit lines BL and ZBL, and mirror memory cells MCa and MCb constantly store complementary data to each other. Thus, as shown in FIG. 18B, when a word line is selected, bit lines BL and ZBL have their respective voltages both varied from the bit line precharge voltage, and the read voltage can equivalently be increased to prevent an erroneous data read operation due to data held by a defective memory cell.

Furthermore, in the mirror memory cell configuration as shown in FIG. 18, if a defect such as a micro short circuit exists between branch word lines, driving these branch word lines by row decoder RD simultaneously to a selected state can drive the word lines with an inter-word line short circuit to a selected state, and thus a defect of such an inter-word line short circuit can be repaired.

In the arrangement shown in FIG. 18A, mirror memory cells are configured of two memory cells MCa and MCb. Thus, if the data stored in a memory cell of one bit is inverted, read data varying in the same direction are transmitted on bit lines BL and ZBL and data cannot be read accurately.

As a large scale integrated circuit (LSI) is microfabricated in recent years, a memory cell capacitor is also miniaturized, and accordingly a memory cell can only store a reduced amount of electric charge. It is thus susceptible to a soft error destroying data of a memory cell or data on a bit line. For the mirroring technique shown in FIG. 16, if a memory cell itself has a defect, the error can be corrected according to the principle of decision by majority. However, if a bit line coupling noise or the like destroys a read voltage after data of a memory cell is read on a bit line and before a sense operation starts and a soft error of a bit line mode is caused, the mirror memory cells are configured of memory cells connected to a common bit line, and all bits would cause a soft error and the data destruction cannot be corrected.

Furthermore, as the operating power supply voltage for the memory cell array is lowered and accordingly the read voltage ΔV read on the bit line is reduced. Therefore, the sensitivity of a self refresh amplifier, the operating margin of the sense fresh amplifier and the like serve as a main factor for data destruction in a read operation. Thus, in a configuration that memory cells of a common bit line are used as mirror memory cells, as shown in FIG. 16, if a bit line coupling noise or the like causes data destruction (read voltage destruction) or a defective operation of a sense refresh amplifier, data cannot be read accurately and the reliability of mirrored data is impaired.

Other types of memory devices also suffer the problem of an erroneous data reading attributed to noise on a bit line. For example, a memory cell of a static random access memory (SRAM) has a flip-flop configuration and stores complementary data. Data reliability needs to be improved against a soft error of a bit line mode attributed to noise on a bit line, rather than a soft error attributed to a defect of a memory cell itself.

FIG. 19 shows an example of a configuration of a conventional memory module. This memory module MM includes memory chips CH0–CH8 corresponding to data bits DQ0–DQ8, respectively. If nine bits of data are stored, one bit, for example, is used for error correction (ECC). However, if the mirror memory cell configuration as shown in FIG. 16 is applied to such a configuration and a parity bit suffers a bit line mode defect, accurate data read and hence accurate parity check cannot be achieved.

Furthermore, in the mirror memory cell arrangement as shown in FIG. 18, if a noise is generated on one bit line and bit lines BL and ZBL of a bit line pair vary bin voltage in the same direction, accurate data read cannot be achieved and data reliability can not be ensured against a bit line mode defect.

SUMMARY OF THE INVENTION

An object of the present invention is to provide a semiconductor memory device with improved data reliability.

Another object of the present invention is to provide a semiconductor memory device capable of accurately restoring data in an original memory cell, ensuring an error correction even if a bit line mode defect occurs.

Further object of the present invention is to provide a semiconductor memory device having an improved mirror memory cell configuration.

In accordance with the present invention, a semiconductor memory device includes a plurality of memory cells, a first select circuit for selecting memory cells from the plurality of memory cells and reading the data stored in the selected memory cells in parallel on a first data line, and a second select circuit for coupling the first data lines with a second data line. The second select circuit couples a predetermined number of first data lines of the plurality of the first data lines with a common second data line of the second data lines in parallel.

With mirror memory cells configured by memory cells arranged corresponding to different data lines, if one data line suffers a noise or the like and a data line mode defect such as a bit line mode defect occurs, it is less likely that the remaining data lines will suffer a soft error attributed, for example, to such a noise. Even if such a soft error is caused, data can be read accurately.

Furthermore, restoring allows accurate data to be written in the mirror memory cell suffering the failure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
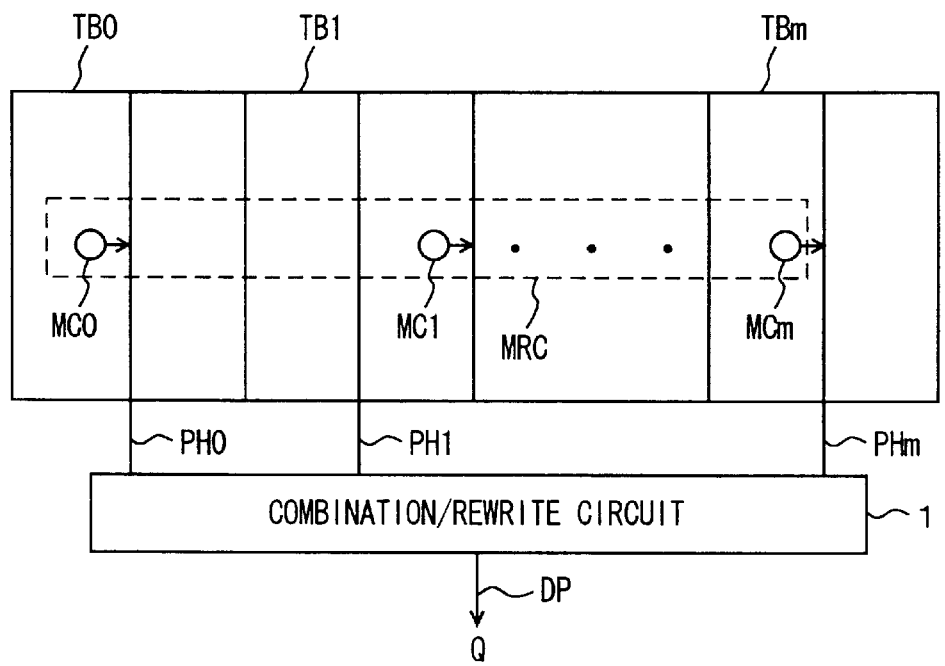
FIG. 1 schematically shows a configuration of a main portion of a semiconductor memory device according to the present invention.

FIG. 1 schematically shows a configuration of a main portion of a semiconductor memory device according to a first embodiment of the present invention. In FIG. 1, the semiconductor memory device includes a plurality of data blocks TB0–TBm, first data lines PH0–PHm provided corresponding to data blocks TB0–TBm, respectively, and a combination/rewrite circuit 1 for combining data read on the first data lines PH0–PHm and transmitting the combined data on a second data line DP, and for receiving combined data from the second data line DP and transferring the received data on the first data lines PH0–PHm for rewriting to corresponding, original memory cells.

Each of data blocks TB0–TBm is only required to have a plurality of memory cells arranged therein and it may be any of a bit line pair, a column block, an IO block, a memory mat and a memory chip. Here, a column block is configured of memory sub arrays arranged, aligned in the direction of a column in a memory array configuration having memory sub arrays arranged in rows and columns. In this configuration, a local IO line is arranged corresponding to each memory sub array and a global data line is arranged corresponding to a column block. A plurality of local IO lines are coupled with a common global data line in parallel.

A mirror memory cell MRC is configured of memory cells MC0–MCm arranged corresponding to the first data lines PH0–PHm, respectively. The first data lines PH0–PHm are provided separately. Thus, if any of the first data lines PH0–PHm suffers a soft error attributed, for example, to noise produced when data is read, it is less probable that the remaining data lines suffer such a soft error. Thus, combination/rewrite circuit 1 additively combines the data on the first data lines PH0–PHm to be able to provide an accurate read data. Since an additive combination is employed to correct data, the number of the first data lines PH0–PHm and hence the number of memory cells MC0–MCm included in mirror memory cell MRC are each an odd number.

Figure 2:
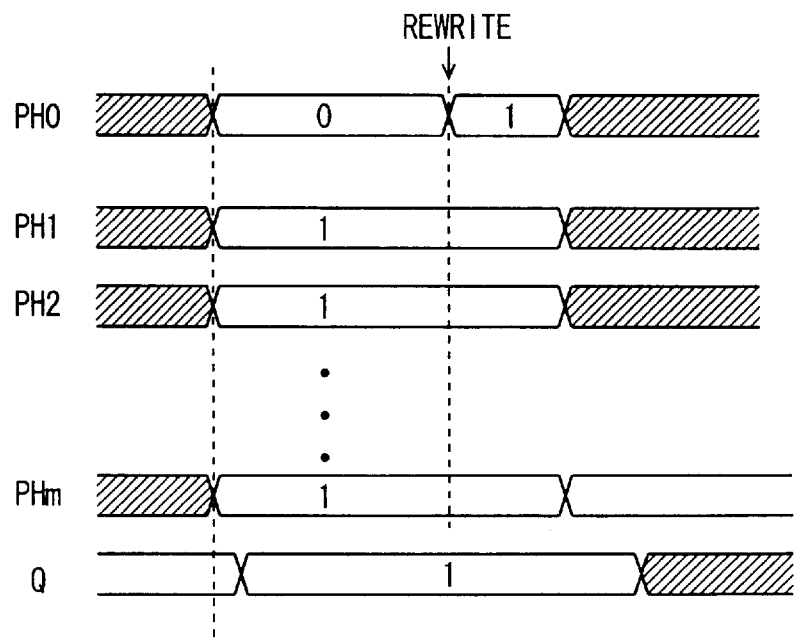
FIG. 2 is a timing chart representing an operation of the semiconductor memory device shown in FIG. 1.

FIG. 2 is a timing chart representing an operation of the FIG. 1 semiconductor memory device when data is read. As shown in FIG. 2, when data is read from mirror memory cell MRC onto the first data lines PH0–PHm, the data read from memory cell MC0 is "0" on the first data line PH0 and on the remaining first data lines PH1–PHm data of "1" is transmitted, for the sake of description. In this assumption, combination/rewrite circuit 1 additively combines together the data on the first data lines PH0–PHm and then transmits the combined data on the second data line DP. Thus, data "1" is output as read data Q. Since combination/rewrite circuit 1 has a rewrite function, data of "1" is transmitted again on the first data lines PH0–PHm according to read data "1" on the second data line DP and read data "0" on the first data line PH0 is corrected into correct data "1". Thus, even if a soft error or the like is caused, data can accurately be read and an error attributed to the soft error can also be corrected. Particularly, by providing the first data lines PH0–PHm on separate data transfer paths, the probability that noise is produced simultaneously on the first data lines PH0–PHm can be reduced to allow data to be accurately read and corrected. Furthermore, even if it is not a soft error but a fixed defect associated with a memory cell is caused, data can be constantly accurately read and such a fixed defect can also be repaired.

Second Embodiment

Figure 3:
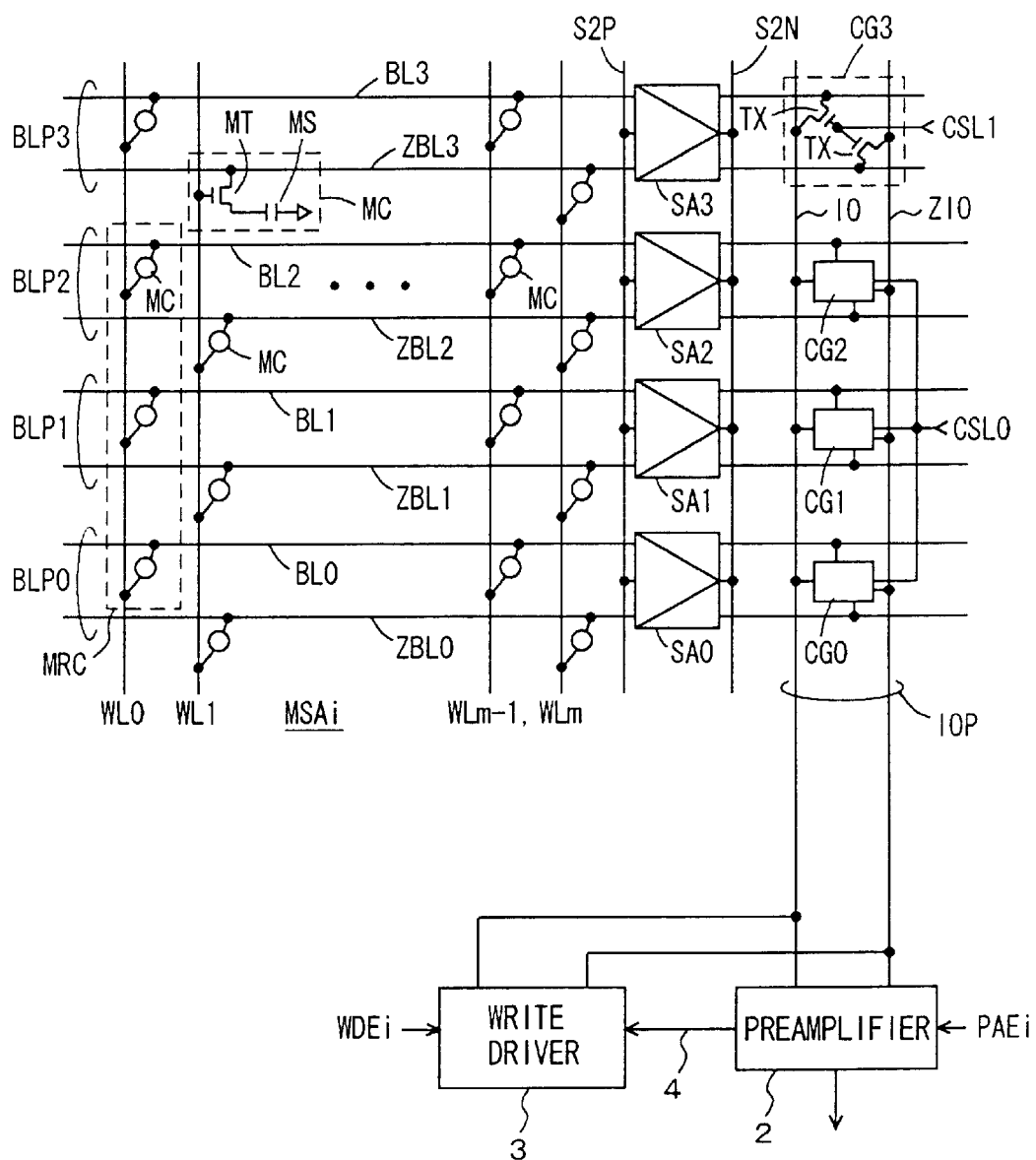
FIG. 3 schematically shows a configuration of a main portion of a semiconductor memory device according to a second embodiment of the present invention.
Figure 12:
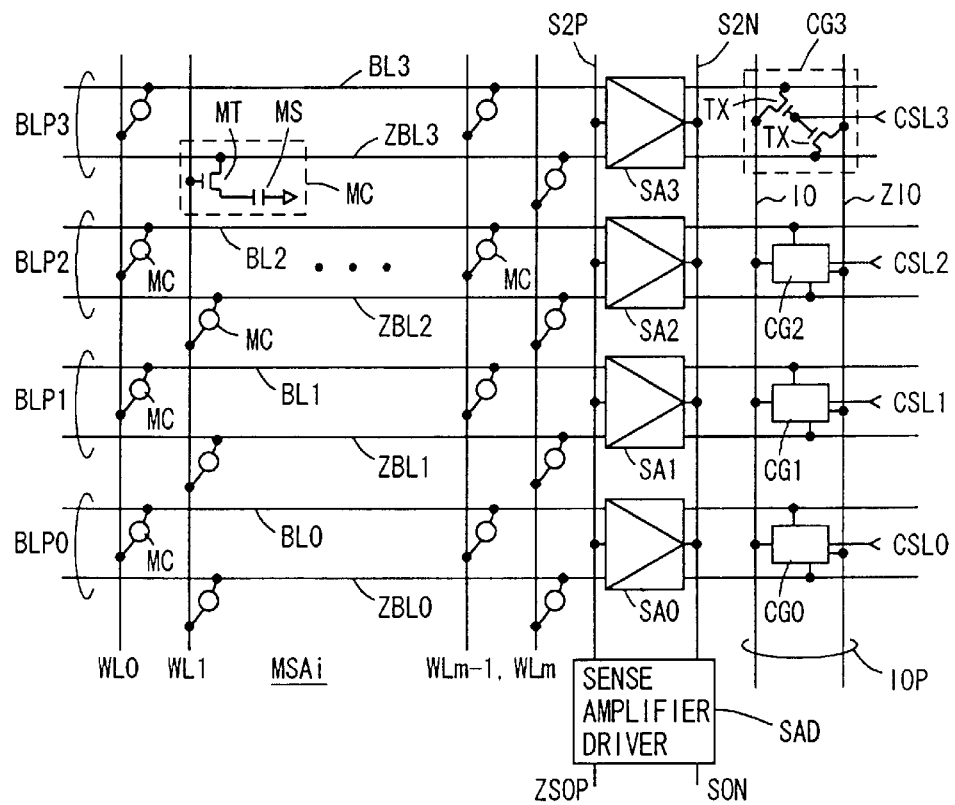
FIG. 12 schematically shows a configuration of an array of the conventional semiconductor memory device.
Figure 13:
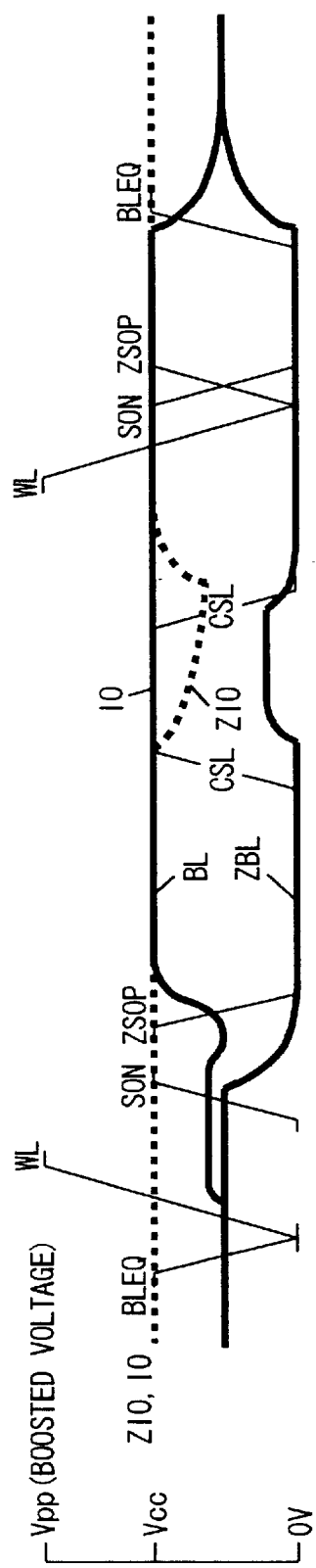
FIG. 13 represents waveforms of a bit line voltage and each control signal when data is read in the semiconductor memory device shown in FIG. 12.
Figure 14:
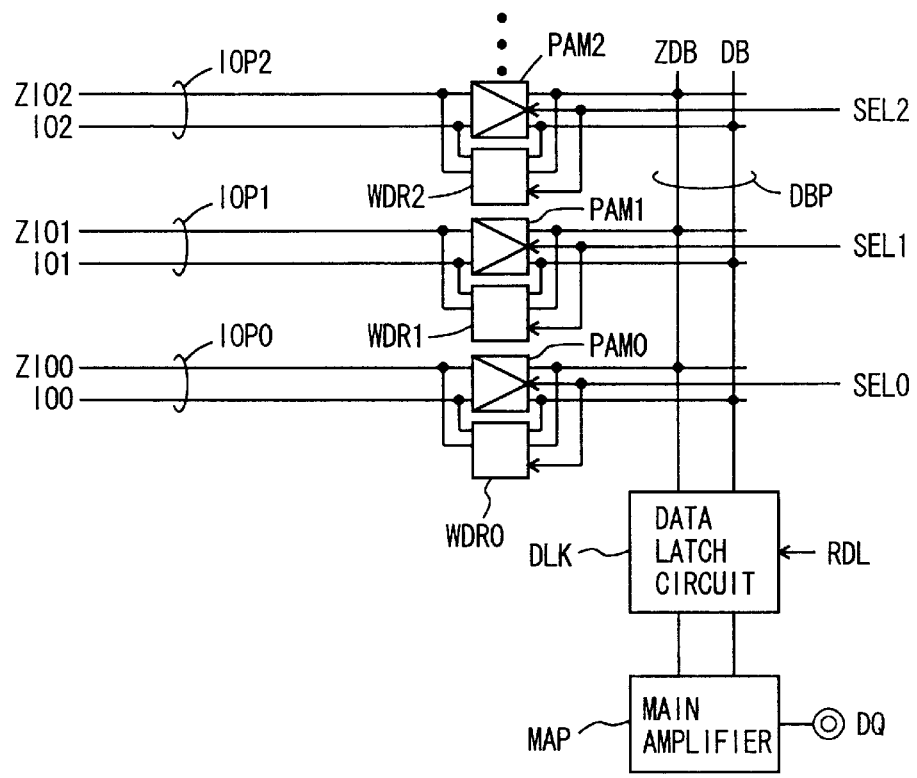
FIG. 14 schematically shows a configuration of a data read portion of a conventional semiconductor memory device.
Figure 15:
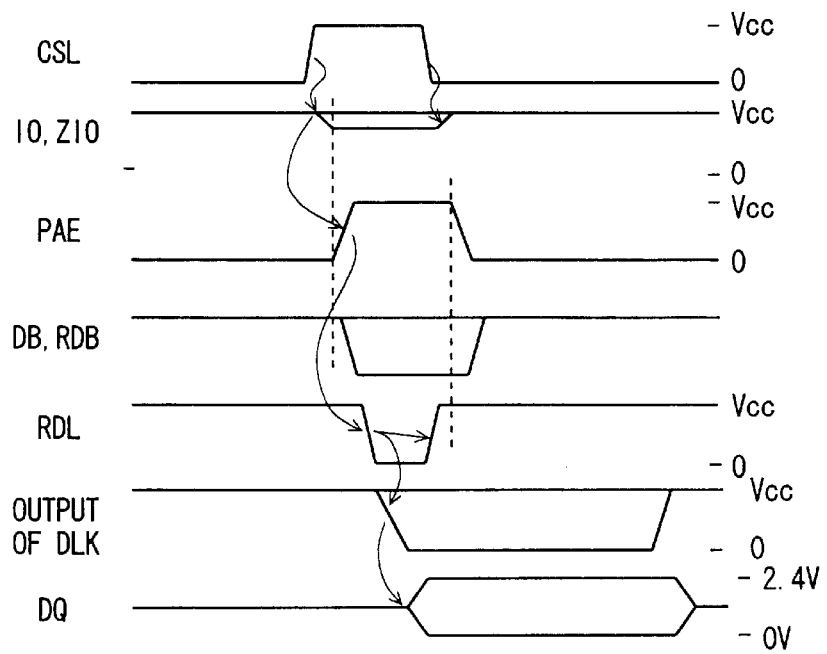
FIG. 15 is a signal waveform diagram representing an operation of the FIG. 14 data read portion.
Figure 16:
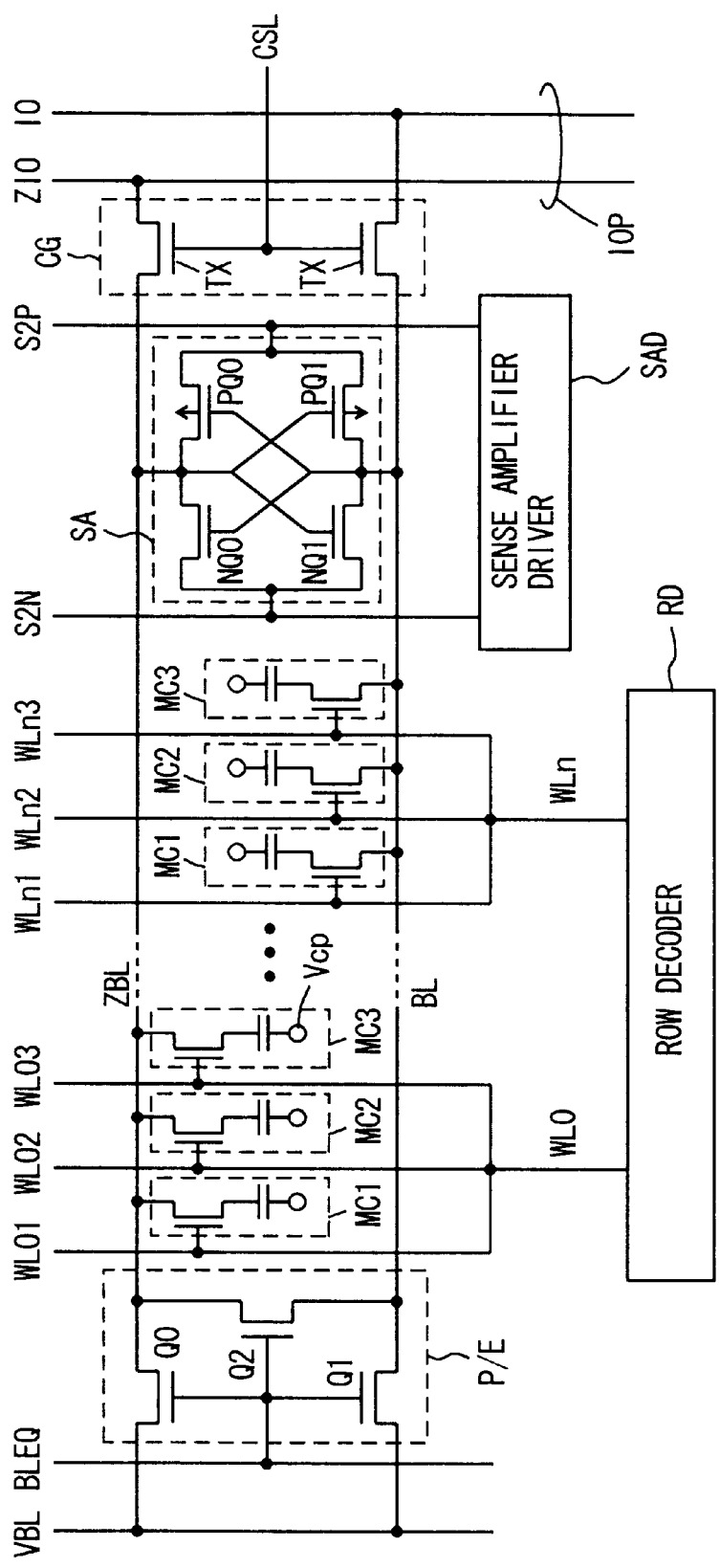
FIG. 16 shows a configuration of an array portion of a semiconductor memory device having conventional mirror memory cells.
Figure 17A:
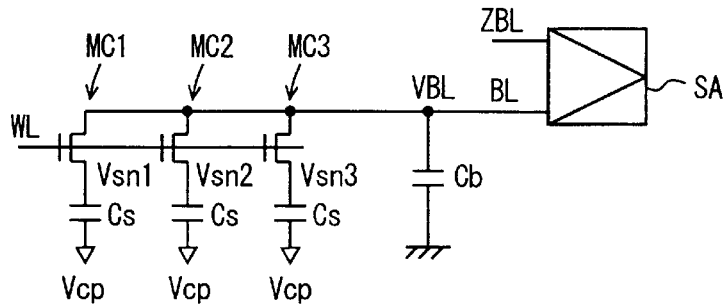
FIGS. 17A–17E are diagrams for illustrating an operation of a conventional mirror memory cells when data is read.
Figure 17B:
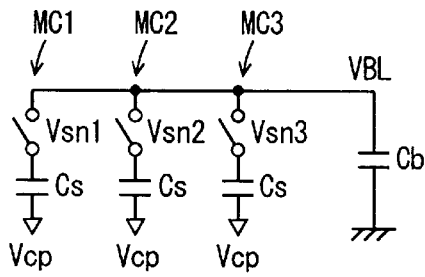
Figure 17C:
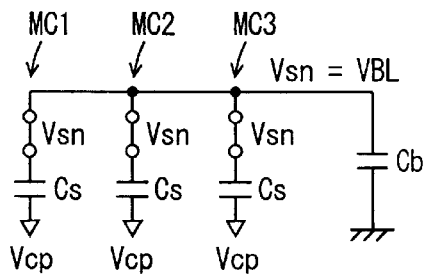
Figure 17D:
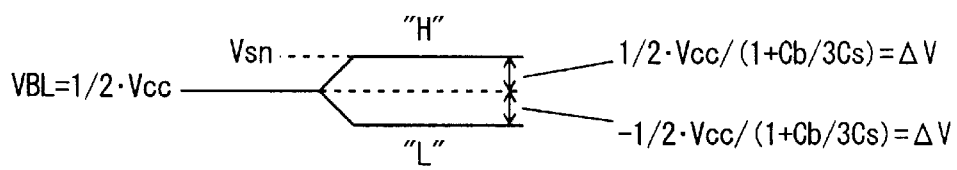
Figure 17E:
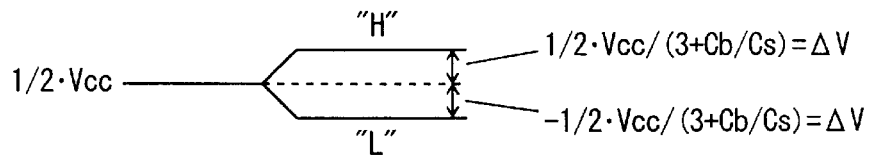
Figure 18A:
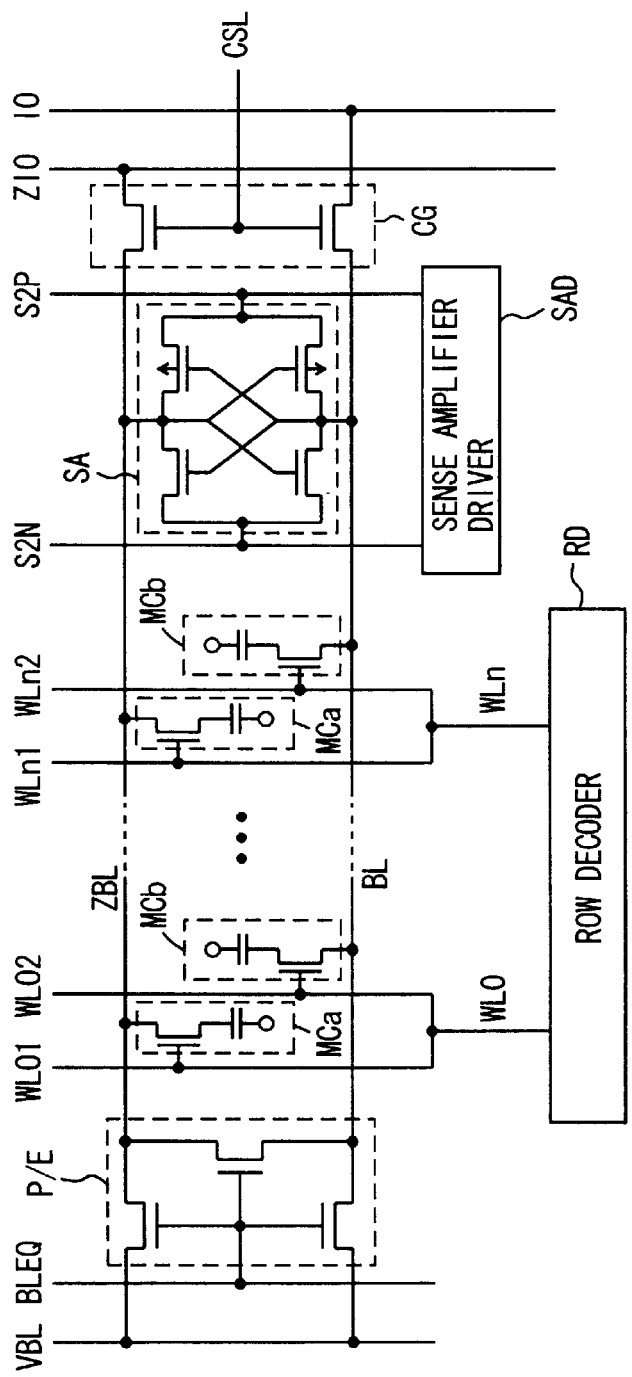
FIG. 18A shows another configuration of conventional mirror memory cells and FIG. 18B represents a variance in bit line voltage for FIG. 18A mirror memory cell when data is read.
Figure 18B:
Figure 19:
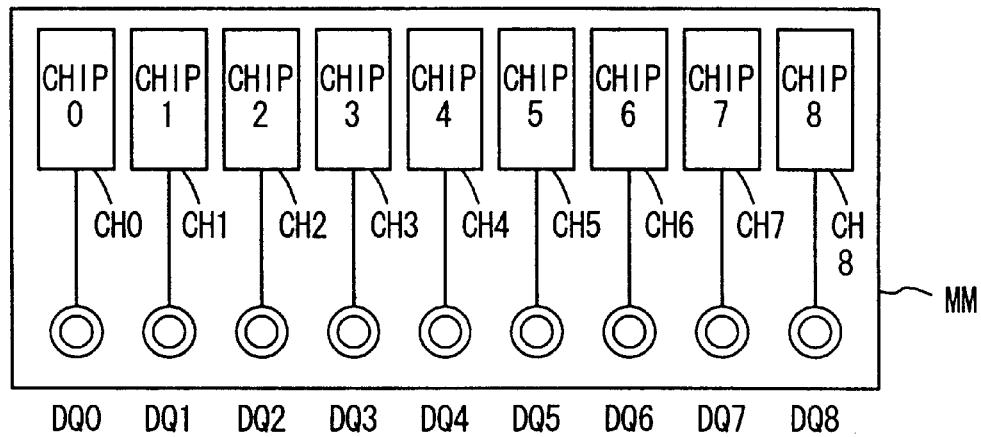
FIG. 19 schematically shows a configuration of a conventional semiconductor module.

FIG. 3 schematically shows a configuration of a main portion of a semiconductor memory device according to a second embodiment of the present invention. In the configuration shown in FIG. 3, bit line pair BLP is used as the first data line. In FIG. 3, bit line pairs BLP0–BLP2 are simultaneously selected by a column select signal CSL0 and coupled with internal IO line pair IOP in parallel. Furthermore, bit line pair BLP3 and bit line pairs BLP4 and BLP5 (not shown) are simultaneously selected by a column select signal CSL1. Thus, mirror memory cell MRC is configured by memory cells of three bits each arranged for a different bit line pair. The memory array is similar in configuration to the conventional memory array as shown in FIG. 12, and corresponding portions are labeled like reference characters.

Internal IO line IOP is coupled with a preamplifier 2 and with a write driver 3. Preamplifier 2 is enabled when a preamplifier enable signal PAEi is activated, and write driver 3 is enabled when a write driver enable signal WDEi is activated. To rewrite data, data amplified by preamplifier 2 is transmitted via a rewrite data line 4 to write driver 3. In response, the amplified data is transmitted to internal IO line pair IOP through the write driver. Preamplifier enable signal PAEi is a signal of a combination(or an AND) of a main preamplifier enable signal PAE and a preamplifier select signal SELi. In this configuration, a sense refresh amplifier and a column select gate configure a circuit combining data together and a preamplifier and a write driver configure a circuit for rewriting data.

Figure 4:
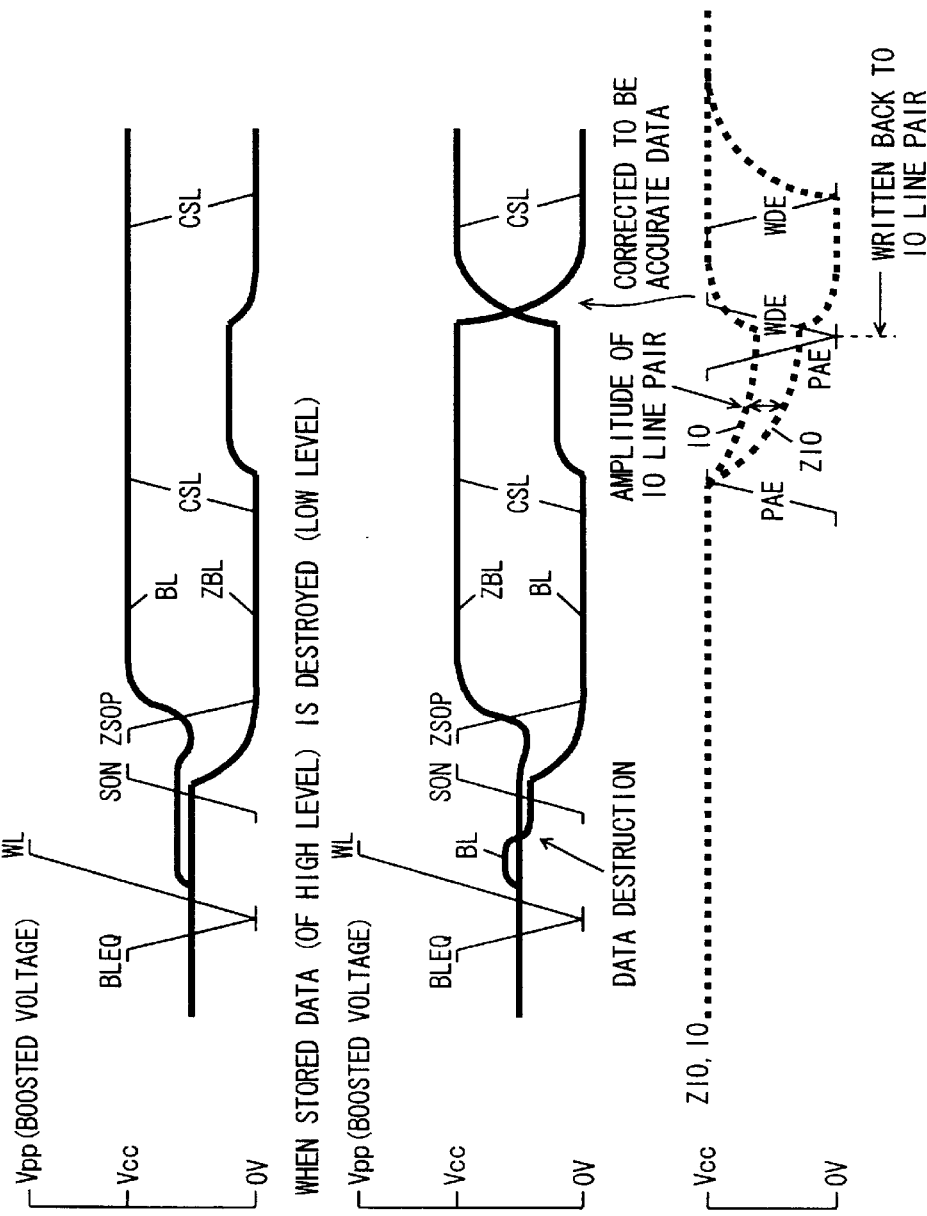
FIGS. 4A and 4B represent a signal waveforms and a bit line voltage waveforms, respectively, when data is read in the semiconductor memory device shown in FIG. 3.

FIG. 4A represents a waveform of a voltage of a bit line when a high level data stored in mirror memory cell MRC is normally read.

In normally reading data, when bit line precharge/equalization instructing signal BLEQ is inactivated and a bit line precharge/equalization circuit (not shown) is disabled, a bit line attains a floating state. In a row select operation, a selected word line is driven to attain a high voltage Vpp level, electric charge corresponding to a high level data is transmitted from memory cell MC configuring a mirror memory cell to a corresponding bit line BL to increase a voltage level of each associated bit line BL. Then, when sense start signal SON and restore signal ZSOP are activated, sense refresh amplifier SA drives bit lines BL and ZBL to the power supply voltage Vcc level and the ground voltage level, respectively.

Then, when column select signal CSL is driven to a selected state, three bit line pairs are coupled to internal IO line pair IOP in parallel in response to a single column select signal CS. Since the three bit lines BLs are at the power supply voltage Vcc level and the three complementary bit lines ZBLs are at the ground voltage level, internal IO lines IO and ZIO attain a high level and a low level, respectively, and data is read normally via preamplifier 2.

In this data read operation, write driver 3 is also operated to rewrite data. Since data destruction cannot be predicted, the possibility of data destruction attributed to noise is considered and data is rewritten regularly even in this normal read operation.

FIG. 4B represents a bit line voltage waveform when data stored in a 1-bit memory cell of a mirror memory cell is destroyed. FIG. 4B represents a voltage waveform of a bit line corresponding to a memory cell having its data destroyed when data is read.

When an active cycle starts to select a memory cell, bit line precharge/equalization instructing signal BLEQ is driven low and a selected word line is then driven to attain the high voltage Vpp level. For the sake of description, it is assumed that a bit line mode error is caused when high-level data is read on bit line BL and the voltage of this bit line BL lowers below the intermediate, precharge voltage level and data is destroyed.

After the bit line voltage varies, sense start signal SON is activated and this bit line BL is driven low and restore signal ZSOP is activated and the complementary bit line ZBL is driven to attain the power supply voltage Vcc level.

Then, column select signal CSL is driven to a selected state, and the mirror memory cell has its memory cells of three bits coupled with internal IO line pair IOP in parallel. Internal IO line IO is coupled with a bit line BL at a low level, and its voltage level decreases to be lower than a precharge voltage level. However, the remaining memory cells of two bits in the mirror memory cell store data of the high level. Internal IO line ZIO is coupled with two, low-level complementary bit lines ZBLs and the voltage level of internal IO line ZIO decreases to be further lower than the voltage of internal IO line IO. Thus, internal IO lines IO and ZIO cause a potential difference (an amplitude) that substantially the same as that caused when a single bit line pair is connected, and preamplifier 2 can sufficiently accurately amplify the signals on internal IO line pair IOP to read internal data.

When preamplifier 2 completes amplification, write driver 3 is then enabled and data amplified by preamplifier 2 is again transmitted via write driver 3 to internal IO line IOP. By write driver 3, data of a high level is rewritten to each memory cell of a selected mirror memory cell or it is latched by a sense amplifier. Thus, data of a memory cell that is destroyed when data is read on a bit line, is restored to be accurate data and an error is thus corrected. Then column select signal CSL is driven to a non-selected state and a column access operation completes.

Note that in FIG. 4B write driver enable signal WDE is activated after preamplifier enable signal PAE is activated. However, in an active period of preamplifier enable signal PAE, write driver enable signal WDE may be activated and preamplifier enable signal PAE and write driver enable signal WDE may be inactivated substantially at the same timing.

Furthermore, internal IO lines IO and ZIO are each connected to a plurality of sense refresh amplifiers in parallel. In the above described state, a sense refresh amplifier latching data of a high level drives a sense refresh amplifier latching data of a low level. Therefore, if sense refresh amplifier drivability is set to the order that the low-level data latched by a sense refresh amplifier is written back to be correct data, it is not particularly required to transmit data amplified by a preamplifier again to an internal IO line pair via the write driver.

If an internal data bus receiving an output of a preamplifier transmits write data and read data on a common internal data transmission line, rewrite data line 4 transferring, via write driver 3, the data amplified by preamplifier 2 is only required to be the same internal data transmission line as the internal data line transferring data from the sense refresh amplifier to the preamplifier.

If an internal write data line and an internal read data line are provided separately, rewrite data line 4 is only required to be configured so as to transmit data on the internal read data line to the internal write data line in response to a preamplifier enable signal, and it may include a transfer gate.

First Variation

Figure 5:
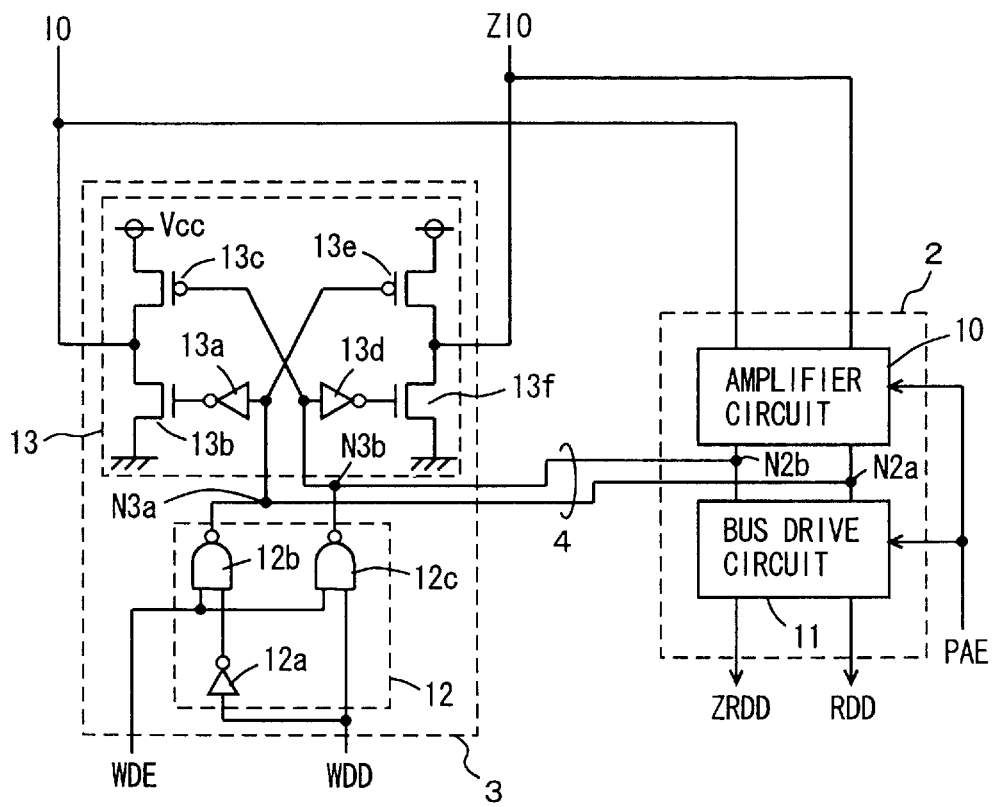
FIG. 5 shows an example of a configuration of a preamplifier and a write driver shown in FIG. 3.

FIG. 5 shows a configuration of a first variation of the second embodiment of the present invention. FIG. 5 shows a configuration of preamplifier 2 and write driver 3 related to a single internal IO line pair.

Preamplifier 2 includes an amplifier circuit 10 activated in response to activation of preamplifier enable signal PAE to amplify data on internal IO lines IO and ZIO, and a bus drive circuit 11 activated in response to activation of preamplifier enable signal PAE to generate internal read data RDD and ZRDD from data amplified by amplifier circuit 10. Amplifier circuit 10 may be a differential amplification circuit, for example. Bus drive circuit 11 may be a latch circuit or wired OR connected drive circuits.

Write driver 3 includes a write enable circuit 12 activated in response to activation of write driver enable signal WDE to generate complementary internal write data pair from write data WDD, and a write bus drive circuit 13 driving internal IO lines IO and ZIO in response to a signal output from write enable circuit 12. Write enable circuit 12 includes an inverter 12a inverting write data WDD, an NAND circuit 12b receiving a signal output from inverter 12a and write driver enable signal WDE, and an NAND circuit 12c receiving write driver enable signal WDE and write data WDD. Write data WDD is a signal of the CMOS level transmitted via a single internal data line.

Write bus drive circuit 13 includes an inverter 13a inverting a signal output from NAND circuit 12b, an N-channel MOS transistor 13b rendered conductive in response to a signal output from inverter 13a at a high level, to drive internal IO line IO to the ground voltage level, a P-channel MOS transistor 13c rendered conductive in response to a signal output from NAND circuit 12c at a low level, to drive internal IO line IO to the power supply voltage Vcc level, a P-channel MOS transistor 13e rendered conductive in response to a signal output from NAND circuit 12b at a low level, to drive internal IO line ZIO to the power supply voltage Vcc level, and an N-channel MOS transistor 13f rendered conductive in response to a signal output from inverter 13d at a high level, to drive internal IO line ZIO to the ground voltage level.

When write driver enable signal WDE is at a low level, NAND circuits 12b and 12c in write enable circuit 12 both output a signal of a high level and MOS transistors 13b, 13c, 13e and 13f in write bus drive circuit 13 are all turned off and write bus drive circuit 13 enters an output high impedance state.

When write driver enable signal WDE attains a high level or an active state, write enable circuit 12 is enabled. More specifically, NAND circuits 12b and 12c generate, at nodes N3a and N3b, data corresponding to write data WDD in accordance with write data WDD. For example, if write data WDD is at a high level, node N3a is at a high level and node N3b is at a low level. Responsively, one of MOS transistors 12c and 12e turns on and one of MOS transistors 12b and 12f turns on according to the voltages of nodes N3a and N3b, and internal IO lines IO and ZIO receive complementary data. For example, when nodes N3a and N3b are at a high level and a low level, respectively, MOS transistors 12c and 12f turn on and MOS transistors 12b and 12e turn off and internal IO lines IO and ZIO are driven to a high level and a low level, respectively.

Rewrite data line 4 serving as a data transfer path for write-back is configured by signal lines for coupling nodes N2a and N2b of preamplifier 2 with nodes N3a and N3b of write driver 3. This arrangement can eliminate the necessity of writing data back via an internal data line of large load, and data can rapidly be written back.

Thus, also in an arrangement allowing internal read data RDD and ZRDD to be transferred in the form of a signal of a small amplitude rapidly and allowing write data WDD to be transferred at the CMOS level, the use of a signal line can readily implement writing back of data. In particular, it is not required to activate write drive enable signal WDE when preamplifier enable signal PAE is activated.

Note that also in the configuration shown in FIG. 5, rewrite data line 4 may be provided with a switch circuit (a transfer gate) turning on in response to preamplifier enable signal PAE.

Furthermore, in the configuration shown in FIG. 5, write data and read data may be transferred on a common data line.

Second Variation

Figure 6:
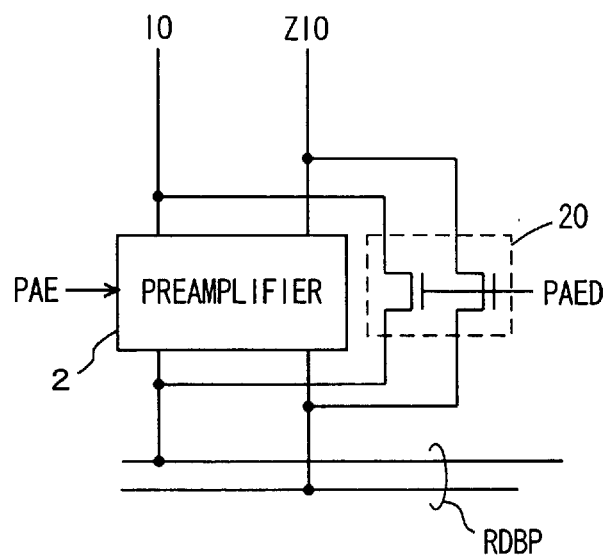
FIG. 6 schematically shows a configuration of a second variation of the second embodiment of the present invention.

FIG. 6 shows a configuration of a second variation of the second embodiment of the present invention. In FIG. 6, a transfer circuit 20 is provided to connect an output node of preamplifier 2 to internal IO lines IO and ZIO in response to a delayed preamplifier enable signal PAED for a predetermined period of time. Preamplifier 2 drives an internal read data line pair RDBP. In response to the signal PAED, a delayed version of preamplifier enable signal PAE, e.g., a signal with a low to high transition delayed, signals output from preamplifier 2 are coupled with internal IO lines IO and ZIO. If the output drivability of preamplifier 2 is large enough to drive internal IO lines IO and ZIO to the CMOS level, even transfer circuit 20 can implement writing back of data.

Note that the transfer circuit 20 as shown in FIG. 6 includes, as a component, a transfer gate configured of a MOS transistor (an insulated-gate type field effect transistor). Alternatively, transfer circuit 20 may be formed of a tristate buffer circuit enabled in response to delayed preamplifier enable signal PAED. Furthermore, transfer circuit 20 may be formed of a tristate buffer for driving internal IO lines IO and ZIO according to the potential on internal nodes N2a and N2b of the preamplifier 2 shown in FIG. 5.

Furthermore, internal read data line pair RDBP may transfer write data and read data, or it may transfer read data only.

Thus, according to the second embodiment of the present invention, an odd number of bit line pairs are coupled with an internal IO line pair in parallel. If there occurs data destruction in a bit line defect mode on a single bit line pair, data can accurately be read depending on data of other memory cells of a mirror memory cell. Furthermore, a memory cell with data destroyed can have data written back and the destroyed data can be accurately recovered.

Third Embodiment

Figure 7:
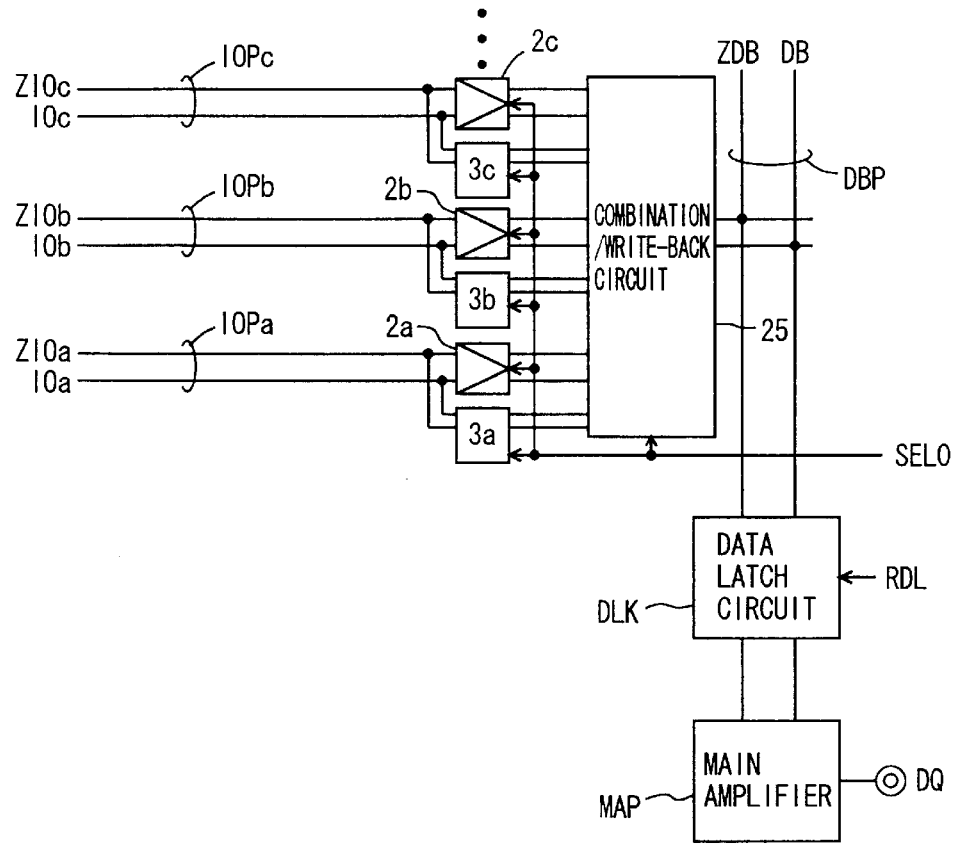
FIG. 7 schematically shows a configuration of a main portion of a semiconductor memory device according to a third embodiment of the present invention.

FIG. 7 schematically shows a configuration of a main portion of a semiconductor memory device according to a third embodiment of the present invention. In FIG. 7, three internal IO line pairs IOPa–IOPc are provided with a combination/write-back circuit 25. Internal IO line pairs IOPa–IOPc are provided with preamplifiers 2a–2c, respectively, and with write drivers 3a–3c, respectively. Preamplifiers 2a–2c and write drivers 3a–3c are coupled with combination/write-back circuit 25 in parallel to communicate data with internal data line pair DBP.

On each of internal IO line pairs IOPa–IOPc, memory cell data of one bit is read, as in a conventional case.

Internal data line pair DBP is provided with data latch circuit DLK and main amplifier MAP, as in a conventional case. Data latch circuit CLK and main amplifier MAP operate as in a conventional case.

Preamplifiers 2a–2c and write drivers 3a–3c commonly receive select signal SEL0. Thus, preamplifiers 2a–2c amplify data on internal IO line pairs IOPa–IOPc and transmit internally read data on internal data line pair DBP, and write drivers 3a–3c drive corresponding internal IO line pairs IOPa–IOPc in parallel according to data transmitted via internal data line pair DBP.

Combination/write-back circuit 25 in reading data combines data received from preamplifiers 2a–2c, drives internal read data line pair DBP, and also transmit combined data via write drivers 3a–3c to internal IO line pairs IOPa–IOPc, respectively. Internal data line pair DBP is normally precharged to the power supply voltage level. Thus, a mirror memory cell is configured of memory cells coupled with different internal IO line pair IOP.

Figure 8:
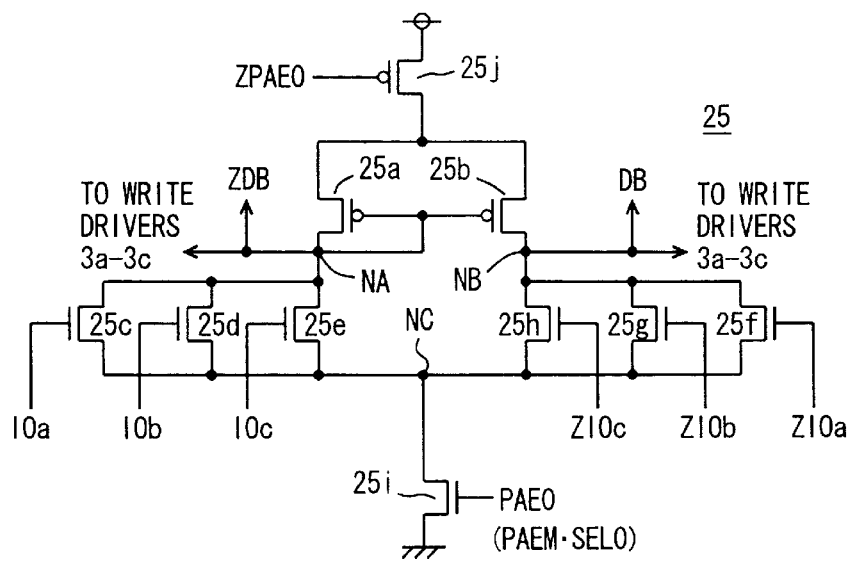
FIG. 8 shows an example of a configuration of a combination/write-back circuit shown in FIG. 7.

FIG. 8 shows an example of a configuration of combination/write-back circuit 25 shown in FIG. 7. In FIG. 8, combination/write-back circuit 25 includes a P-channel MOS transistor 25j coupled with a power supply node and having its gate receiving a complementary preamplifier enable signal ZPAE0, a P-channel MOS transistor 25a connected between MOS transistor 25j and an internal node NA and having its gate connected to internal node NA, a P-channel MOS transistor 25b connected to MOS transistor 25j and a node NB and having its gate connected to internal node NA, N-channel MOS transistors 25c–25e connected between internal nodes NA and NC in parallel and having their gates connected to the respective internal IO lines 10a–10c, N-channel MOS transistors 25f–25h connected between internal nodes NB and NC in parallel and having their respective gates connected to internal IO lines Z10a–Z10c, and an N-channel MOS transistor 25i connected between internal node NC and a ground node and having its gate receiving preamplifier enable signal PAE0.

Preamplifier enable signal PAE0 is provided by an AND-ing (logical product) operation of main preamplifier enable signal PAEM and select signal SEL0. Complementary preamplifier enable signal ZPAE0 is an inverted version of preamplifier enable signal PAE0.

Internal node NA is connected to internal data line ZDB and an internal node of each of write drivers 3a–3c, and internal node NB is connected to internal data line DB and an internal node of each of write drivers 3a–3c. Internal nodes NA and NB and the internal nodes of write drivers 3a–3c are connected in a configuration similar to that of the first embodiment. For example, nodes NA and NB are coupled with internal nodes N3b and N3a, respectively, of write driver 13 as shown in FIG. 5.

MOS transistors 25a and 25b configure a current mirror circuit and a current equal in magnitude to that flowing through MOS transistor 25a flows through MOS transistor 25b.

In the combination/write-back circuit 25 shown in FIG. 8, when internal IO lines 10a–10c are all at a high level, a current flowing from node NA to node NC increases to be larger than that flowing from node NB to node NC. Accordingly, the current mirror circuit formed of MOS transistors 25a and 25b allows node NB to attain an increased voltage level and internal data line DB receives a signal of a high level.

If data of one bit is inverted, e.g., when internal IO line 10a is at a low level and internal IO lines 10b and 10c are at a high level, a relatively large current flows through MOS transistors 25d, 25e and 25f. In this case, however, a combined conductance of MOS transistors 25d and 25e between nodes NA and NC increases to be larger than that between nodes NA and NC, and a large current passes through node NA and the signal at node NB attains a high level. Thus, even if data of one bit is inverted, data can be read accurately.

Furthermore, by transmitting a voltage of nodes NA and NB in combination/write-back circuit 25 via write drivers 3a–3c to internal IO line pairs IOPa–IOPc, erroneous data of an internal IO line pair can be corrected to be accurate data, and simultaneously the error can also be corrected.

Note that in writing data, preamplifier enable signal PAE0 is at a low level, MOS transistors 25i and 25j are turned off and nodes NA and NB are in a floating state. In writing data, even if nodes NA and NB vary in potential in accordance with write data and an internal IO line has a voltage level varying to be a high level in accordance with write data, since MOS transistors 25i and 25j are both turned off to cut off the current flowing path in the combination/write back circuit, current consumption can be prevented in writing the data.

Note that internal data line pair DBP may transfer read data and write data on separate signal lines. In this case also, a write back circuit (a rewrite data line) similarly configured as shown in the second embodiment can also be used to write read data back.

Note that write drivers 3a–3c are each similar in configuration to write driver 3 of the second embodiment, and are coupled in parallel to a data line transmitting write data.

Furthermore, if internal IO line pairs IOPs are provided separately for write data and for read data, a write column select gate for transferring the write data to a memory cell is turned on in rewriting data. Since a column address for writing data back is the same as that for reading data, a delayed version of preamplifier enable signal PAE is simply applied to enable a write column select circuit (a column decoder). Data to be written back is transferred on an internal data write line and via a write column select gate to a selected memory cell.

Thus, according to the third embodiment of the present invention, memory cells coupled with different internal IO line pairs are used as a unit. A unit bit of a mirror memory cell, i.e., data on internal IO line pairs are used as a unit bit of mirror data. Memory cell data of different memory sub arrays are read individually, and therefore, there is only a small possibility that these memory cell data are simultaneously error data, and accurate data can be read and data reliability can be improved. Furthermore, correcting and rewriting read data allows error data to be corrected accurately.

Fourth Embodiment

Figure 9:
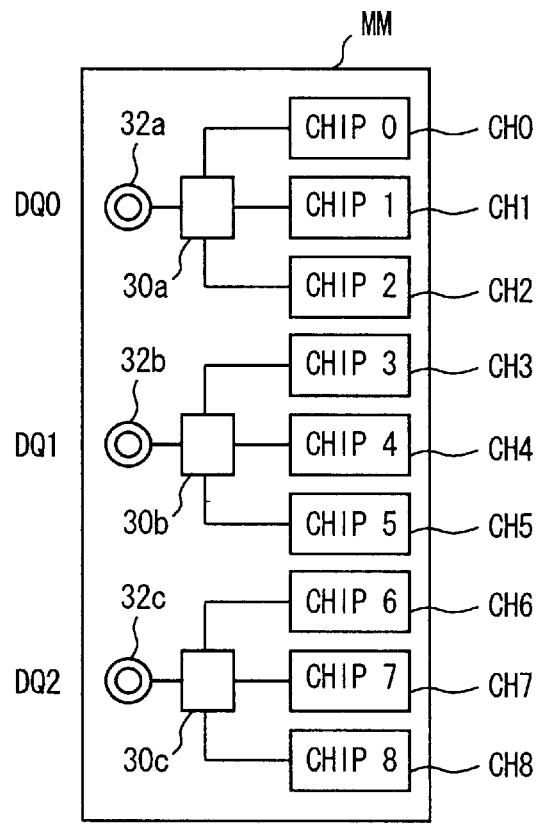
FIG. 9 schematically shows a entire configuration of a semiconductor memory device according to a fourth embodiment of the present invention.

FIG. 9 schematically shows a general configuration of a semiconductor memory device according to a fourth embodiment of the present invention. In FIG. 9 the semiconductor memory device is a module MM and it includes a plurality of chips CH0–CH8. A combination/rewrite circuit 30a is provided for chips CH0–CH2 and a combination/rewrite circuit 30b is provided for chips CH3–CH5. A combination/rewrite circuit 30c is provided for chips CH6–CH8. Combination/rewrite circuits 30a–30c communicate data externally via data input/output terminals 30a–30c, respectively. Combination/rewrite circuit 32a–32c combine together data read from the corresponding chips CHs and write the combined data back to the corresponding chips.

In the configuration shown in FIG. 9, memory cells of different chips configure a mirror memory cell and a unit bit of mirror data is read from different memory chips. Thus, the unit memory cell data of a mirror data are distant from each other, and there is only a small possibility that memory cells of multiple bits have an error. Thus, the mirror data can be improved in reliability. Furthermore, rewriting data via combination/rewrite circuit 32a–32c allows error data to be corrected.

Figure 10:
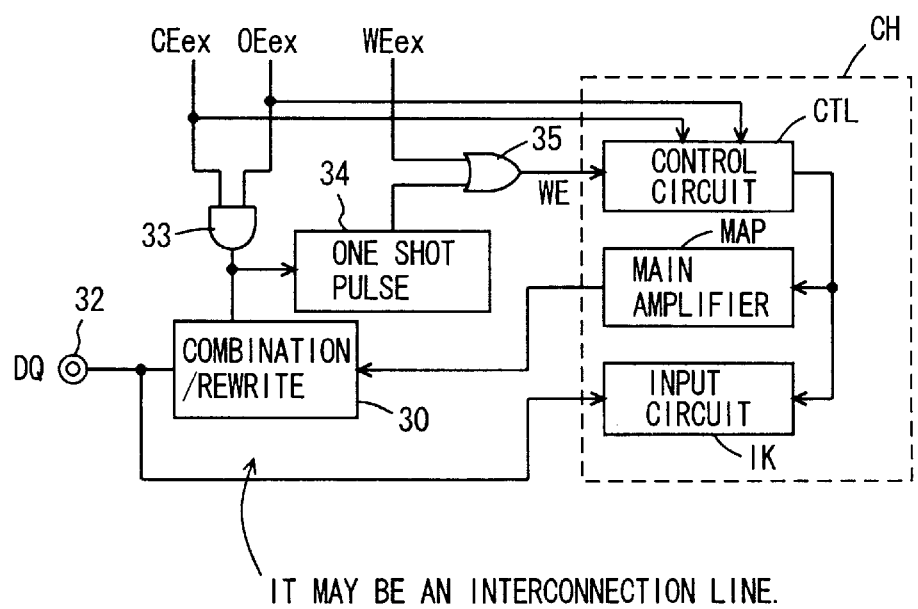
FIG. 10 schematically shows a configuration of a portion related to one chip of the semiconductor memory device shown in FIG. 9.
Figure 11:
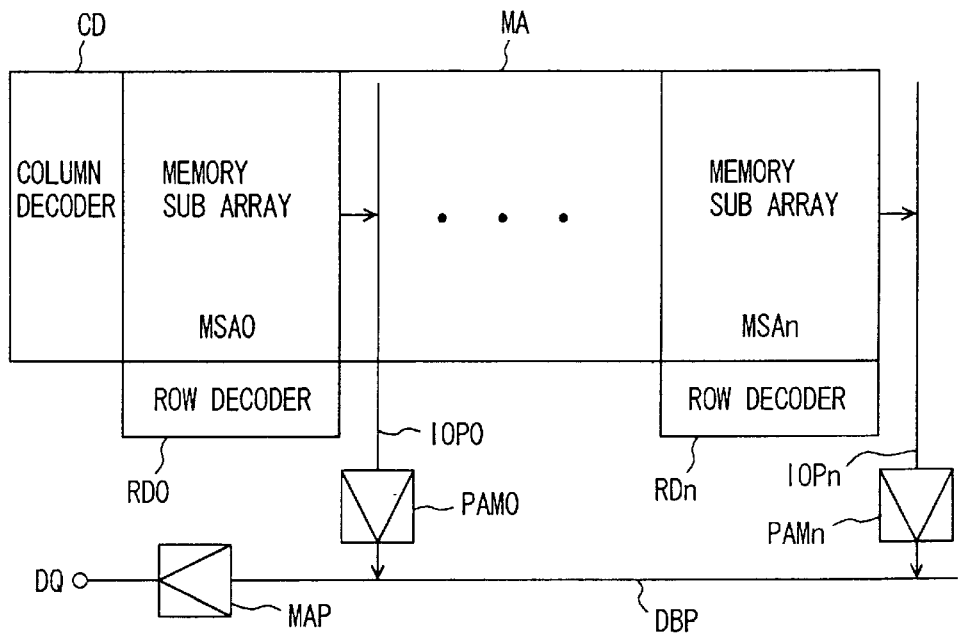
FIG. 11 schematically shows a configuration of a main portion of a conventional semiconductor memory device.

FIG. 10 shows more specifically a configuration for a single chip CH of the memory module MM shown in FIG. 9. In FIG. 10, for combination/rewrite circuit 30, there are provided an AND circuit 33 externally receiving a chip enable signal CHex and an output enable signal OEex, a one shot pulse generation circuit 34 for generating a one shot pulse signal in response to a signal output from AND circuit 33, and an OR circuit 35 receiving the pulse signal output from one shot pulse generation circuit 34 and an external write enable signal WEex and generating a write enable signal WE. When the signal output from AND circuit 33 is activated, combination/rewrite circuit 30 is activated to combine data read from main amplifier MAP of a corresponding chip CH and transmit the combined data to a data terminal 32 and an input circuit IK internal to chip CH. A control circuit CTL in chip CH controls the operation of main amplifier MAP and that of input circuit IK in response to external control signals CHex and OEex and write enable signal WE received from OR circuit 35.

In reading data, data read from main amplifier MAP is combined by combination/rewrite circuit 30 for externally output, when one shot pulse generation circuit 34 generates a one-shot pulse signal and OR circuit 35 responsively activates write enable signal WE for a predetermined period of time. In response to the activation of write enable signal WE, chip CH is placed in a data write mode and the data combined by combination/rewrite circuit 30 is transmitted internally via input circuit IK and thus rewritten into an original selected memory cell.

Note that AND circuit 33, one-shot pulse generation circuit 34 and OR circuit 35 may be shared by all of combination/rewrite circuits 30 in memory module MM or they may be provided for each individual combination/rewrite circuit 30.

Furthermore, combination/rewrite circuit 30 may be similar in configuration to the combination/write-back circuit 25 in the third embodiment as shown in FIG. 8. Alternatively, combination/rewrite circuit 30 may be a simple signal line that interconnects an output node of a main amplifier of a corresponding chip CH. Since a plurality of main amplifiers simultaneously drive a corresponding data terminal 32, a configuration with such an interconnection lines allows accurate data to be externally read according to the "principle of decision by majority." The read data is again internally taken in via internal circuit IK and erroneous data is also corrected into accurate data.

Note that for memory module MM, a so-called "read modify write" operation may be determined as a mode of operation to be performed in reading data in a specification.

Furthermore, separately provided data input terminal and data output terminal in memory module MM can also be similarly effective.

Furthermore, configuring each of chips CH0–CH8 to input/output multibit data are also similarly effective. If multibit data is input/output, bits of the same digit may be combined by a combination/rewrite circuit and each chip may be provided with a combination/rewrite circuit for each predetermined number of bits of the multibit data. In this arrangement, data output from a predetermined number of main amplifiers in a single chip, form mirror data.

Thus, in the fourth embodiment, read data are mirrored at an external to a chip, data can accurately be read and error data can also be corrected and data reliability can thus be improved even in a module configuration.

Other Embodiments

In the above description, a semiconductor memory device is assumed to be a DRAM. This DRAM may be a standard DRAM or a synchronous DRAM operating in synchronization with a clock signal.

Furthermore the semiconductor memory device may be an SRAM.

The present invention is also applicable if an IO line pair is a separated IO structure allowing write data and read data to be transmitted via separate paths. In this configuration, a signal output from a preamplifier is simply combined and transmitted to a data line transmitting the write data.

Furthermore, a global IO line of a column block may be coupled with a plurality of local IO lines. Memory cells of different row blocks configure a mirror memory cell. In this example, row decoders arranged for a predetermined number of row blocks are only required to be driven simultaneously. The row block is formed of memory sub arrays aligned in the direction of the row in a memory array configuration having memory sub arrays arranged in rows and columns.

Thus, in accordance with the present invention, mirror data can have a unit bit configured on a data line basis, there is only a small possibility that the mirror data has data of a plurality of bits having an error simultaneously caused, and data reliability can be improved. Use of the inventive memory device as a main memory device of a computers system, such as a server, a work station and the like, can increase the reliability of storage data and stabilize the entire system. Furthermore, mirrored data can function as mutually highly reliable backup data and data can be enhanced in reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells;
   a first select circuitry for reading data of selected memory cells from said plurality of memory cells in parallel on first data lines arranged corresponding to the selected memory cells; and
   a second select circuitry connected between the first data lines and a common second data line, said second select circuitry for coupling a predetermined number of first data lines with said common second data line and for combining data from said predetermined number of said first data lines on said common second data line in parallel.

2. The semiconductor memory device according to claim 1, wherein
   said memory cells are arranged in rows and columns;
   the first data lines each comprise a bit line pair arranged corresponding to a column of memory cells;
   said second data line includes at least one internal data line pair; and
   said second select circuitry couples said predetermined number of bit line pairs, in parallel, with a common internal data line pair of said at least one internal line pair in response to a column select signal for selecting columns of said columns of memory cells.

3. The semiconductor memory device according to claim 1, wherein the first data lines comprise a plurality of internal data lines each coupled with a memory cell selected from said plurality of memory cells in response to a column select signal selecting columns of said columns of memory cells;

said second data line comprises at least one internal data transmission line; and said second select circuitry couples a predetermined number of internal data lines of said plurality of internal data lines, in parallel, with a common internal data transmission line of said at least one internal data transmission line.

4. The semiconductor memory device according to claim 1, wherein said plurality of memory cells are divided into a plurality of memory chips;

the first data lines includes a plurality of out-chip data lines provided external to the chips, corresponding to said plurality of memory chips, said out-chip data lines being arranged at least one for each memory chip, to transfer and receive data to and from corresponding memory chips;

said second data line includes at least one out-chip common data line provided external to the chips and shared by a predetermined number of memory chips of said plurality of memory chips; and said second select circuitry couples out-chip data lines provided for said predetermined number of memory chips with a same out-chip common data line of said at least one common data line external to the chip.

5. The semiconductor memory device according to claim 1, wherein said second select circuitry includes a read data combination circuit for combining data on a corresponding, predetermined number of the first data lines and transmitting combined data to a corresponding second data line when data is read.

6. The semiconductor memory device according to claim 1, wherein said second select circuitry further includes a rewrite circuit for transmitting data on said second data line to a corresponding first data line when data is read.

7. The semiconductor memory device according to claim 1, wherein data stored in the memory cells coupled to the predetermined number of the first data lines are the same in logic level when said memory cells are non-defective to correctly store data.

8. The semiconductor device according to claim 1, wherein said predetermined number is an odd number.

* * * * *